(12) United States Patent
Zhang et al.

(10) Patent No.: US 10,583,534 B2
(45) Date of Patent: Mar. 10, 2020

(54) JOINTING DEVICE FOR METAL MASK PLATE WELDING AND WELDING METHOD THEREOF

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Jian Zhang, Beijing (CN); Junjie Huang, Beijing (CN); De Zhang, Beijing (CN); Dejian Liu, Beijing (CN); Rong Zhao, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/714,622

(22) Filed: Sep. 25, 2017

(65) Prior Publication Data
US 2018/0085865 A1    Mar. 29, 2018

(30) Foreign Application Priority Data
Sep. 26, 2016 (CN) .......................... 2016 1 0852200

(51) Int. Cl.
*B23K 37/00* (2006.01)
*B23K 37/04* (2006.01)
(Continued)

(52) U.S. Cl.
CPC ...... *B23K 37/0408* (2013.01); *B23K 11/0026* (2013.01); *B23K 31/02* (2013.01);
(Continued)

(58) Field of Classification Search
None
See application file for complete search history.

(56) References Cited

U.S. PATENT DOCUMENTS

| | | | | |
|---|---|---|---|---|
| 5,742,483 A | * | 4/1998 | Ma | H05K 3/3421 |
| | | | | 174/260 |
| 2013/0168703 A1 | * | 7/2013 | Mei | H01L 33/50 |
| | | | | 257/88 |

(Continued)

FOREIGN PATENT DOCUMENTS

| CN | 102011088 A | 4/2011 |
|---|---|---|
| CN | 202208755 U | 5/2012 |

(Continued)

OTHER PUBLICATIONS

Chinese Decision on Rejection issued in Chinese Application No. 201610852200.9 dated Apr. 24, 2018 (with English translation).

(Continued)

*Primary Examiner* — Erin B Saad
(74) *Attorney, Agent, or Firm* — McDermott Will & Emery LLP

(57) ABSTRACT

A jointing device for metal mask plate welding includes a jointing device body. A height of the jointing device body is smaller than a welding height of a welding gun. The jointing device body has a through-hole corresponding to a welding area of a metal mask. A width of the through-hole is larger than a welding spot diameter of the welding gun. The jointing device body is used for jointing the metal mask to a metal mask receiving frame.

5 Claims, 2 Drawing Sheets

(51) Int. Cl.
*B23K 11/00* (2006.01)
*C23C 14/04* (2006.01)
*B23K 31/02* (2006.01)
*H01L 51/00* (2006.01)
*B23K 101/36* (2006.01)
*H01L 51/56* (2006.01)

(52) U.S. Cl.
CPC ........ *C23C 14/042* (2013.01); *H01L 51/0011* (2013.01); *B23K 2101/36* (2018.08); *H01L 51/56* (2013.01)

(56) References Cited

U.S. PATENT DOCUMENTS

| | | | | |
|---|---|---|---|---|
| 2014/0000792 | A1* | 1/2014 | Ko | C23C 14/042 156/150 |
| 2016/0115580 | A1* | 4/2016 | Mizumura | C23C 14/042 118/720 |
| 2017/0194564 | A1 | 7/2017 | Ma et al. | |

FOREIGN PATENT DOCUMENTS

| | | |
|---|---|---|
| CN | 103668056 A | 3/2014 |
| CN | 103911584 A | 7/2014 |
| CN | 103913902 A | 7/2014 |
| CN | 104282582 A | 1/2015 |
| CN | 105607412 A | 5/2016 |
| CN | 105951041 A | 9/2016 |
| CN | 205594305 U | 9/2016 |
| JP | H06-235055 A | 8/1994 |
| JP | H08-325705 A | 12/1996 |

OTHER PUBLICATIONS

Chinese First Office Action issued in corresponding Chinese Patent Application No. 201610852200.9, dated Jul. 24, 2017; with English translation.

Chinese Notification of Secon Office Action issued in corresponding Chinese Patent Application No. 201610852200.9, dated Oct. 23, 2017; with English translation.

Chinese Search Report issued in corresponding Chinese Patent Application No. 201610852200.9, dated May 11, 2017, with English translation.

Third Office Action issued in Chinese Patent Application No. 201610852200.9, dated Feb. 6, 2018; with English translation.

* cited by examiner

JOINTING DEVICE FOR METAL MASK PLATE WELDING AND WELDING METHOD THEREOF

CROSS-REFERENCE TO RELATED APPLICATION

This application claims priority to Chinese Patent Application No. 201610852200.9, filed on Sep. 26, 2016, titled "JOINTING DEVICE FOR METAL MASK PLATE WELDING AND WELDING METHOD THEREOF", which is incorporated herein by reference in its entirety.

TECHNICAL FIELD

The present disclosure relates to the field of organic light emitting display technology, and more particularly, to a jointing device for metal mask plate welding and welding method thereof.

BACKGROUND

At present, OLED (Organic Light-Emitting Diode) displays have advantages such as low power consumption, high contrast, high color gamut, flexible display, etc., and thus more and more attention is paid to the OLED displays.

The OLED displays may be divided into PMOLED (Passive matrixorganic light emitting diode) displays and AMOLED (Active-matrix organic light emitting diode) displays according to a drive mode.

AMOLED displays have a manufacturing process as follows. In a first step, OLED materials are evaporated onto a LTPS (Low Temperature Poly-silicon) back panel by an evaporation method according to a predetermined procedure. And in a second step, red, green and blue pixel units are formed on the LTPS back panel using patterns on a metal mask plate. In the manufacturing process of the metal mask plate, after a metal mask is completely attached on a metal mask receiving frame by a fixture, the metal mask is to be welded to the metal mask receiving frame to form the metal mask plate.

SUMMARY

The present disclosure provides a jointing device for metal mask plate welding which adopts the following technical solutions.

The jointing device for metal mask plate welding may include a jointing device body having a height smaller than a welding height of a welding gun. The jointing device body has a through-hole corresponding to a welding area of a metal mask. A width of the through-hole is larger than a welding spot diameter of the welding gun. The jointing device body is used for jointing the metal mask to a metal mask receiving frame.

Optionally, the height of the jointing device body is less than or equal to about 3 mm.

Optionally, the width of the through-hole is about 2 mm-8 mm.

Optionally, the length of the through-hole is larger than or equal to the width of the metal mask.

Optionally, the jointing device body is a weak magnetic jointing device body.

Optionally, material of the jointing device body is a weak magnetic ore or weak magnetic stainless steel.

The present disclosure also provides a method for welding a metal mask plate, in which an aforementioned jointing device for metal mask plate welding is used to weld the metal mask plate. The method for welding a metal mask plate adopts the following technical solutions.

The method for welding a metal mask plate includes: placing a metal mask to be welded onto a metal mask receiving frame; placing a jointing device body of a jointing device for metal mask plate welding onto the metal mask, jointing the metal mask to the metal mask receiving frame completely, and making a through-hole in the jointing device body correspond to a welding area of the metal mask; welding the metal mask and the metal mask receiving frame through the through-hole: and taking down the jointing device for metal mask plate welding after the welding is completed.

BRIEF DESCRIPTION OF THE DRAWINGS

In order to describe technical solutions in embodiments of the present disclosure or in the prior art more clearly, the accompanying drawings to be used in the description of embodiments or the prior art will be introduced briefly. Obviously, the accompanying drawings to be described below are merely some embodiments of the present disclosure, and a person of ordinary skill in the art can obtain other drawings according to those drawings without paying any creative effort.

DESCRIPTION OF REFERENCE SIGNS

1—jointing device body, 11—through-hole, metal mask, 3—metal mask receiving frame, 4—welding gun.

DETAILED DESCRIPTION

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 6:
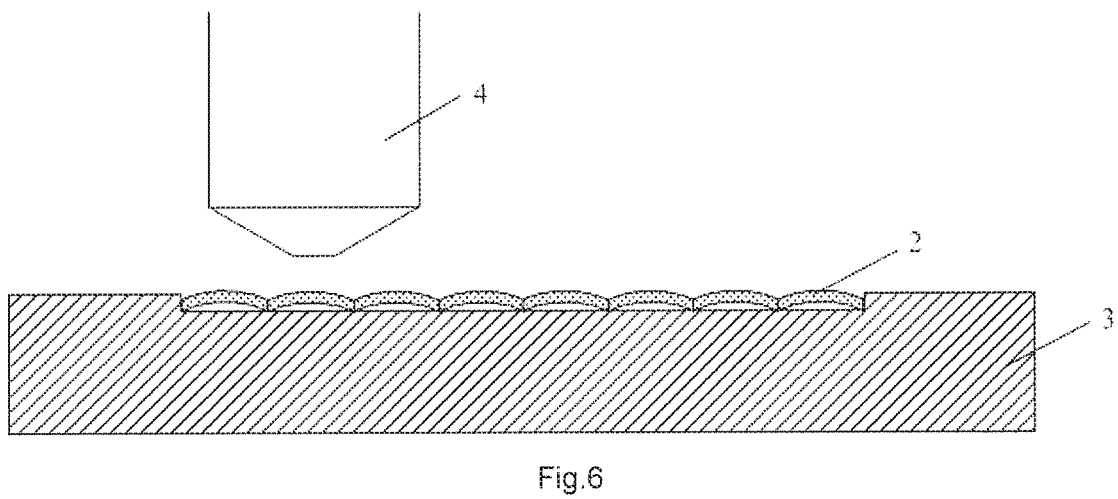
FIG. 6 is a schematic cross-sectional view of a welding area of a metal mask plate.

In the process of welding the metal mask to the metal mask receiving frame, a fixture as shown in FIG. 6 is used to make the metal mask joint to the metal mask receiving frame. However, this fixture may not be able to make the metal mask completely joint to the metal mask frame, causing the flatness of the formed metal mask beyond an allowable range, leading to rosin joint in the metal mask plate welding process, so that different degrees of color mixing phenomenon may appear on the red, green and blue pixel units evaporated with this metal mask plate, resulting in a poor display effect of the AMOLED display device.

Figure 1:
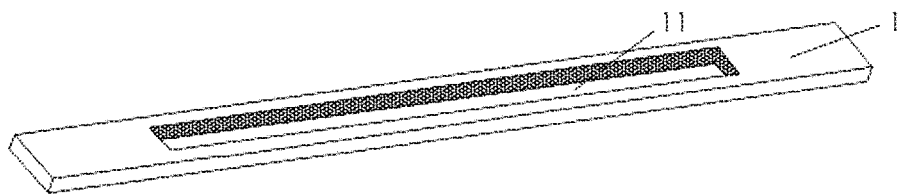
FIG. 1 is a 3D schematic view of a structure of a jointing device for metal mask plate welding according to an embodiment of the present disclosure.

An embodiment of the present disclosure provides a jointing device for metal mask plate welding. As shown in FIG. 1, this jointing device comprises a jointing device body 1 having a height smaller than the welding height of the welding gun. The jointing device body 1 has a through-hole 11 corresponding to a welding area of a metal mask. A width of the through-hole 11 is larger than a welding spot diameter of the welding gun. The jointing device body 1 is used for jointing the metal mask to a metal mask receiving frame.

Figure 2:
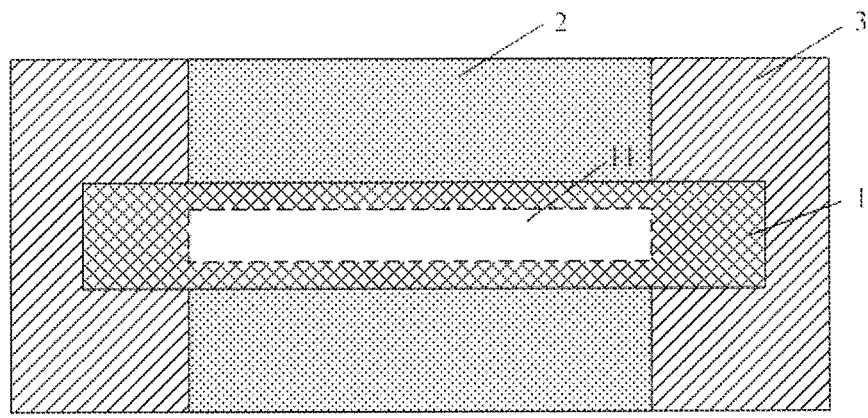
FIG. 2 is a top view of a welding area of a metal mask plate when a jointing device for metal mask plate welding provided by an embodiment of the present disclosure is used for welding.

FIG. 2 shows a metal mask plate welded using the above jointing device for metal mask plate welding. Firstly, a metal mask 2 to be welded is placed on a metal mask receiving frame 3. Then, the jointing device body 1 of the jointing device for metal mask plate welding is placed on the metal mask 2, so that the metal mask 2 is completely jointed to the metal mask receiving frame 3. In addition, the through-hole of the jointing device body 1 is corresponding to the welding area of the metal mask 2 (In this figure, the dotted line area is the welding area of the metal mask 2, which is overlapped with the through-hole 11 on the jointing device body 1). In turn, the metal mask 2 is welded to the metal mask receiving frame 3 by a welding gun through the through-hole 11. Finally, the jointing device for metal mask plate welding is taken down after the welding is completed.

In the technical solution of the present embodiment, the jointing device body 1 has a height smaller than a welding height of the welding gun, and has a through-hole 11 corresponding to a welding area of a metal mask. In addition, the width of the through-hole 11 is larger than the welding spot diameter of the welding gun. Therefore, in the whole process of welding the metal mask and the metal mask receiving frame, the jointing device for metal mask plate welding may be placed on the metal mask in the entire process. And the jointing device body of the jointing device for metal mask plate welding may produce a pressure pointed to the metal mask receiving frame to the metal mask, such that the metal mask may be jointed onto the metal mask receiving frame completely, avoiding the situation that folds are produced due to the incomplete joint of the metal mask and the metal mask receiving frame. Finally, the jointing device for metal mask plate welding may be taken down after the welding is completed. It can be seen that when the jointing device for metal mask plate welding is used to weld the metal mask and the metal mask receiving frame, the situation that folds are produced due to the incomplete joint of the metal mask and the metal mask receiving frame in a welding process resulting in a poor flatness of metal mask is avoided, and the situation of rosin joint is avoided, so as to avoid the appearance of the colour mixture phenomenon of the red, green and blue pixel units evaporated with the metal mask. And thus the display effect of the AMOLED display device is improved.

As for the height of the above jointing device body, the inventors found that when the height of the jointing device main body is too large, the welding height of the welding gun may be made smaller than the height of the jointing device body, resulting in the welding gun colliding with the jointing device body when a welding occurs. Therefore, in order to enable the jointing device to be suitable for various welding guns, in an embodiment of the present disclosure, the height of the jointing device body is less than or equal to about 3 mm. For example, the height of the jointing device body is 1 mm, 2 mm, or 3 mm.

In addition, as for the width of the through-hole in the jointing device body, it can be considered from the following two aspects. On one hand, the inventors found that when the width of the through-hole is too large, it may affect the jointing degree between the periphery portion of the welding area of the metal mask and the metal mask receiving frame, which will result in small folds on the metal mask plate, and thus the width of the through-hole needs to be less than or equal to about 8 mm. On the other hand, the width of the through-hole needs to be larger than the welding spot diameter of the welding gun. And when the width of the through-hole is larger than 2 mm, it can be applied to a variety of welding guns. Therefore, in an embodiment of the present disclosure, the width of the through-hole is about 2 mm to 8 mm. For example, the width of the through-hole is 2 mm, 4 mm, 6 mm, or 8 mm.

In addition, each metal mask may have a plurality of different welding areas. And the plurality of different welding areas may have different sizes. In order to enable the above jointing device to be suitable for welding of a plurality of different welding areas of the metal mask and the metal mask receiving frame, in an embodiment of the present disclosure, the length of the through-hole is greater than or equal to the width of the metal mask, so that the through-hole can be applied to welding areas with different sizes on the metal mask.

It should be noted that the inventors found that when the above jointing device body is a magnetic jointing device body, since the metal mask receiving frame is generally an iron-containing member, the magnetic jointing device body not only generates a pressure pointed to the metal mask receiving frame to the metal mask, but also generates an attractive force pointed to the metal mask to the metal mask receiving frame through the magnetic attraction principle, thereby making the metal mask joint more closely to the metal mask receiving frame. However, when the magnetism of the jointing device body is excessively large, it is possible to damage and contaminate the metal mask. Therefore, in an embodiment of the present disclosure, the jointing device body is a weak magnetic jointing device body. It should be noted that the magnetic property of the weak magnetic jointing device body in the embodiment of the present disclosure is measured by the magnetization coefficient. When the magnetization coefficient is constant, the magnetic body is a weak magnetic body.

By way of example, the above jointing device body may be made of a weak magnetic ore, which is relatively easy to be obtained and has a low cost (i.e., an ore containing a small amount of $Fe_3O_4$), by grinding. Alternatively, the above jointing device body may be made of a stainless steel, which has a low technology difficulty and is easy to be cut (such as 301 stainless steel, 304 stainless steel, etc.), by industrial magnetization.

In order to facilitate understanding and practice by those skilled in the art, an embodiment of the present disclosure provides a specific jointing device for metal mask plate welding below.

Assuming that the width of the metal mask is 70 mm, the welding height of the welding gun is 6 mm, and the welding spot diameter of the welding gun is 0.4 mm.

Figure 3:
FIG. 3 is a front view of a jointing device for metal mask plate welding according to an embodiment of the present disclosure.
Figure 4:
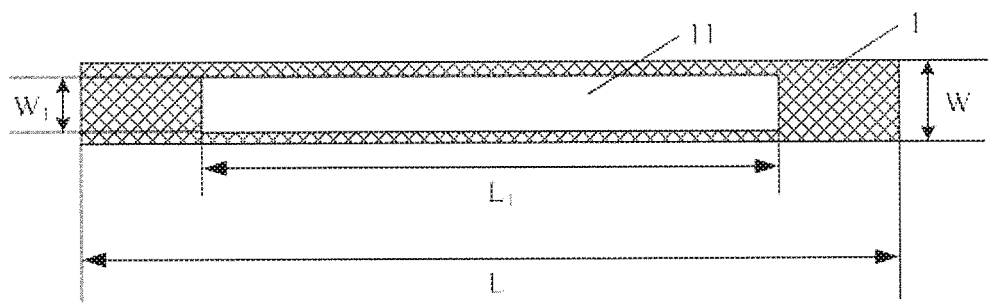
FIG. 4 is a top view of a jointing device for metal mask plate welding according to an embodiment of the present disclosure.
Figure 5:
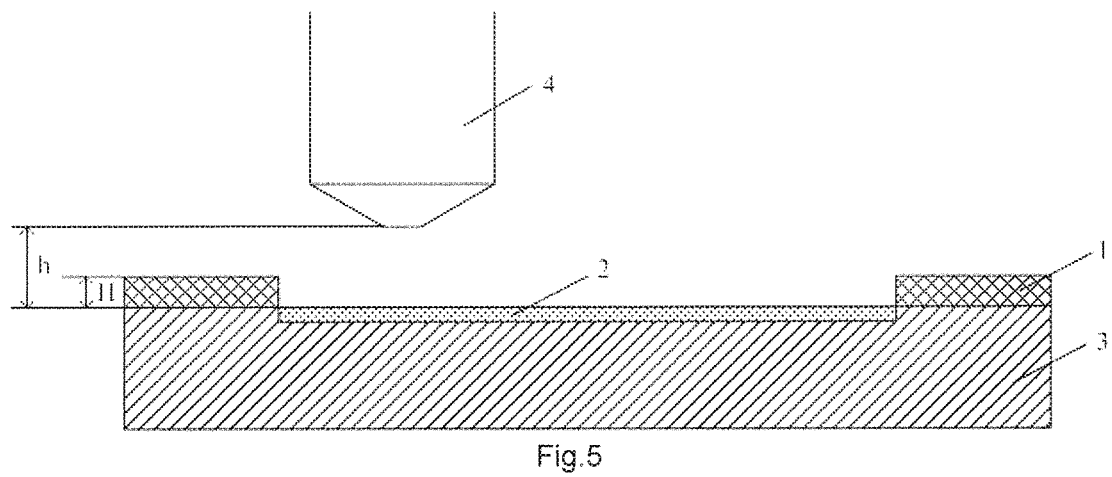
FIG. 5 is a schematic cross-sectional view of a welding area of a metal mask plate when the jointing device for metal mask plate welding provided by an embodiment of the present disclosure is used for welding.

By way of example, as shown in FIGS. 3, 4 and 5, the shapes of the jointing device body 1 and the through-hole 11 thereof are both regular rectangular parallelepiped so as to be easily produced.

In an example, the length L of the jointing device body 1 is selected as 100 mm. The length L of the jointing device body 1 is slightly larger than the width of the metal mask 2 along the length of the jointing device body 1, so that the length of the through-hole 11 in the jointing device body 1 may be larger than or equal to the width of the metal mask 2. And thus the through-hole 11 may be applied to the welding areas with different sizes on the metal mask 2. In an example, the width W of the jointing device body 1 is selected as 10 mm, so that the jointing device body 1 may generate a pressure sufficiently large pointed to the metal mask receiving frame 3 to the metal mask 2. And thus the metal mask 2 is fully jointed to the metal mask receiving frame 3. In an example, the height H of the jointing device body 1 is selected as 3 mm. The height H of the jointing device body 1 is smaller than the welding height h of the welding gun 4, so that the welding gun 4 has a safety distance of 3 mm from the jointing device body 1. And thus the welding gun 4 may not collide with the jointing device body 1 to ensure the normal operation of the welding.

In an example, the length of the through-hole 11 is selected as 70 mm, that is, the length of the through-hole 11 is the same as the width of the metal mask 2 so that the through-hole may be just applied to the widths of the welding areas with different sizes on the metal mask 2. In an example, the width $W_1$ of the through-hole 11 is selected as 6 mm, which is much larger than the welding spot diameter of the welding gun 4, so that the situation that the welding is not performed well due to a smaller width of the through-hole 11 will not happen, ensuring the normal welding. In an example, the height of the through-hole 11 is the height H of the jointing device body 1.

However, if the jointing device for metal mask welding described in above embodiments is not used between the metal mask and the metal mask receiving frame during the welding, as shown in FIG. 6, the metal mask 2 may not be fully jointed to the metal mask receiving frame 3. And thus folds will be produced on the metal mask 2.

By comparing FIG. 5 with FIG. 6, it can be seen that a metal mask may be jointed to a metal mask receiving frame completely when the jointing device for metal mask welding is used to weld the metal mask and the metal mask receiving frame. Therefore, the situation that folds are produced due to the incomplete joint of the metal mask and the metal mask receiving frame during the welding which will result in a poor flatness of metal mask plate is effectively avoided, improving the flatness of metal mask plate. Therefore, an appearance of the colour mixture phenomenon of the red, green and blue pixel units evaporated with the metal mask plate is avoid, and thus the display effect of the AMOLED display device is improved.

An embodiment of the present disclosure provides a method for welding a metal mask plate using the jointing device for metal mask plate welding according to the above embodiments of the present disclosure. The method for welding a metal mask plate includes the following steps.

In a first step (S1), a metal mask to be welded is placed onto a metal mask receiving frame.

In a second step (S2), a jointing device body of the jointing device for welding metal mask plate is placed onto the metal mask, to joint the metal mask to the metal mask receiving frame completely, and to make a through-hole in the jointing device body correspond to a welding area of the metal mask.

In turn, in a third step (S3), the metal mask and the metal mask receiving frame are welded through the through-hole.

Finally, in a fourth step (S4), the jointing device for metal mask plate welding is taken down after the welding is completed.

In the technical solution of the present embodiment, in the whole process of welding the metal mask and the metal mask receiving frame with the above welding method, the jointing device for metal mask plate welding may be placed on the metal mask in the entire process. And the jointing device body of the jointing device for metal mask plate welding may produce a pressure pointed to the metal mask receiving frame to the metal mask. Therefore, the metal mask may be jointed onto the metal mask receiving frame completely, avoiding the situation that folds are produced due to the incomplete joint of the metal mask and the metal mask receiving frame, and then improving the flatness of metal mask. In addition, the situation of rosin joint is avoided during process of welding the metal mask plate. And thus the appearance of the colour mixture phenomenon of the red, green and blue pixel units evaporated with the metal mask plate is avoided. And thus the display effect of the AMOLED display device is improved.

It should be noted that, after the welding of one welding area on the metal mask with the metal mask receiving frame is completed using the above welding method, when a next welding area on the metal mask is welded with the metal mask receiving frame, there are two ways to place the jointing device for metal mask plate welding:

First, the jointing device for metal mask plate welding may be manually removed and be placed onto the next welding area of the metal mask.

Second, an automated robotic arm may be used to lift the jointing device for metal mask plate welding. When the area of the through-hole of the jointing device for metal mask plate welding used in the welding process is small and is just larger than the welding spot area of the welding gun used, after the welding at one welding spot is completed, an automated robotic arm may be used to lift the jointing device for metal mask plate welding and to transfer the jointing device for metal mask plate welding to the next welding spot for welding. Since the through-hole of the jointing device for metal mask plate welding used in the embodiments of the present disclosure is corresponding to a welding area of the metal mask, after finishing the welding of one welding spot, the welding of all welding spots in one welding area may be completed just by controlling the position of a laser through an angle of a laser refracting sheet in the welding gun, without transferring the jointing device for metal mask plate welding. In turn, the jointing device for metal mask plate welding may be lift by the automated robotic arm and transferred to the next welding area for welding. Therefore, the welding time of the metal mask plate is shortened effectively.

The above description is only specific embodiments of the present disclosure, but the scope of the present disclosure is not limited thereto, and any person skilled in the art will be able to easily think of variations or substitutions within the technical scope of the present disclosure, and they should be covered within the scope of the present disclosure. Accordingly, the protection scope of the present disclosure should be based on the protection scope of the claims.

What is claimed is:

1. An assembly, comprising:
   a metal mask receiving frame;
   a metal mask configured to be disposed on the metal mask receiving frame; and
   a jointing device body,
   wherein the metal mask receiving frame includes a groove formed in a surface of the metal mask receiving frame proximate to the jointing device body, the metal mask is configured to be disposed in the groove, and a depth of the groove is equal to a thickness of the metal mask in the groove, and the jointing device body is configured to be disposed on a side of the metal mask opposite the metal mask receiving frame, is physically touching the metal mask and the metal mask receiving frame in a case where the jointing device body is disposed on the side of the metal mask opposite the metal mask receiving frame, and is removable from the metal mask and the metal mask receiving frame, and wherein a welding area of the metal mask corresponds to a through-hole of the jointing device body.

2. The assembly according to claim 1, wherein the metal mask receiving frame is directly connected to the metal mask.

3. The assembly according to claim 1, wherein a width of the through-hole is within a range from approximately 2 mm-8 mm.

4. The assembly according to claim 1, wherein a height of the jointing device body is less than or equal to about 3 mm.

5. The assembly according to claim 1, wherein a length of the through-hole is greater than or equal to a width of the metal mask.

* * * * *